(12) United States Patent
Yu et al.

(10) Patent No.: US 11,139,281 B2
(45) Date of Patent: Oct. 5, 2021

(54) MOLDED UNDERFILLING FOR PACKAGE ON PACKAGE DEVICES

(71) Applicant: Taiwan Semiconductor Manufacturing Company, Ltd., Hsin-Chu (TW)

(72) Inventors: Chen-Hua Yu, Hsin-Chu (TW); Chien-Hsun Lee, Chu-Tung Town (TW); Jung Wei Cheng, Hsin-Chu (TW); Tsung-Ding Wang, Tainan (TW); Ming-Da Cheng, Jhubei (TW); Yung Ching Chen, Dali (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 333 days.

(21) Appl. No.: 15/174,743

(22) Filed: Jun. 6, 2016

(65) Prior Publication Data

US 2016/0284676 A1     Sep. 29, 2016

Related U.S. Application Data

(62) Division of application No. 13/667,060, filed on Nov. 2, 2012, now Pat. No. 9,362,197.

(51) Int. Cl.
*H01L 25/10*     (2006.01)
*H01L 21/56*     (2006.01)
(Continued)

(52) U.S. Cl.
CPC ........ *H01L 25/105* (2013.01); *H01L 21/4853* (2013.01); *H01L 21/563* (2013.01);
(Continued)

(58) Field of Classification Search
CPC ... H01L 23/52; H01L 25/105; H01L 21/4853; H01L 21/563; H01L 21/565;
(Continued)

(56) References Cited

U.S. PATENT DOCUMENTS

| | | | |
|---|---|---|---|
| 6,274,081 B1 | 8/2001 | Fuchs | |
| 7,777,351 B1 * | 8/2010 | Berry | H01L 23/3128 257/778 |

(Continued)

FOREIGN PATENT DOCUMENTS

TW            511811 U        11/2002

*Primary Examiner* — Steven B Gauthier
*Assistant Examiner* — Christopher A Culbert
(74) *Attorney, Agent, or Firm* — Slater Matsil, LLP

(57) ABSTRACT

Presented herein are a package-on-package device having a molded underfill and a method for forming the same, the method comprising applying a package mount mounting a die to the first side of a carrier package. A molded underfill may be applied first side of the carrier package, and be in contact with a portion of the package mount a portion of a sidewall of the die. A top package having at least one land may be mounted to the first side of the carrier package above the die, and, optionally separated from the top of the die. The package mount may be coined prior to, during or after applying the molded underfill to optionally be level with the underfill surface. The underfill region contacting the package mount may be below or above the surface of the underfill region contacting the die sidewall.

20 Claims, 10 Drawing Sheets

(51) Int. Cl.
   *H01L 25/00* (2006.01)
   *H01L 23/31* (2006.01)
   *H01L 21/48* (2006.01)
   *H01L 23/498* (2006.01)
   *H01L 23/00* (2006.01)

(52) U.S. Cl.
   CPC ........ *H01L 21/565* (2013.01); *H01L 23/3128* (2013.01); *H01L 23/3185* (2013.01); *H01L 23/49811* (2013.01); *H01L 23/49838* (2013.01); *H01L 25/50* (2013.01); *H01L 24/73* (2013.01); *H01L 2224/16225* (2013.01); *H01L 2224/32145* (2013.01); *H01L 2224/32225* (2013.01); *H01L 2224/48227* (2013.01); *H01L 2224/73265* (2013.01); *H01L 2224/81192* (2013.01); *H01L 2225/0651* (2013.01); *H01L 2225/06568* (2013.01); *H01L 2225/1023* (2013.01); *H01L 2225/1041* (2013.01); *H01L 2225/1052* (2013.01); *H01L 2225/1058* (2013.01); *H01L 2225/1088* (2013.01); *H01L 2924/15311* (2013.01); *H01L 2924/15331* (2013.01); *H01L 2924/18161* (2013.01)

(58) Field of Classification Search
   CPC ............. H01L 23/3128; H01L 23/3185; H01L 23/49811; H01L 23/49838; H01L 25/50; H01L 24/73; H01L 2224/16225; H01L 2224/32145; H01L 2224/32225; H01L 2224/48227; H01L 2224/73265; H01L 2224/81192; H01L 2225/0651; H01L 2225/06568; H01L 2225/1023; H01L 2225/1041; H01L 2225/1052; H01L 2225/1058; H01L 2225/1088; H01L 2924/15311; H01L 2924/15331; H01L 2924/18161

See application file for complete search history.

(56) References Cited

U.S. PATENT DOCUMENTS

| | | |
   |---|---|---|
   | 8,158,888 B2 | 4/2012 | Shen et al. |
   | 2003/0094692 A1 | 5/2003 | Ho et al. |
   | 2006/0170112 A1* | 8/2006 | Tanaka .................. H01L 23/481 257/777 |
   | 2008/0169544 A1* | 7/2008 | Tanaka .................. H01L 21/561 257/686 |

* cited by examiner

MOLDED UNDERFILLING FOR PACKAGE ON PACKAGE DEVICES

This application is a divisional application of and claims priority to U.S. patent application Ser. No. 13/667,060, filed on Nov. 2, 2012, entitled "Molded Underfilling for Package on Package Devices," which application is incorporated herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones. While PoP technology has allowed for a lower package profile, the total thickness reduction is currently limited by the solder ball joint height between the top package and bottom package. Dies are sometimes mounted to an interposer substrate or other packaging carrier via a ball grid array, land array, solid interposer stud array, or the like. In some instances, an undermount filler or underfill may be applied between the die and the interposer PC board to fill the spaces between the mounting conductors.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable concepts that can be embodied in a wide variety of specific contexts. The specific embodiments discussed are merely illustrative of specific ways to make and use the disclosure, and do not limit the scope of the disclosure. Note that, for simplification, not all element numbers are included in each subsequent drawing. Rather, the element numbers most pertinent to the description of each drawing are included in each of the drawings.

Figure 1:
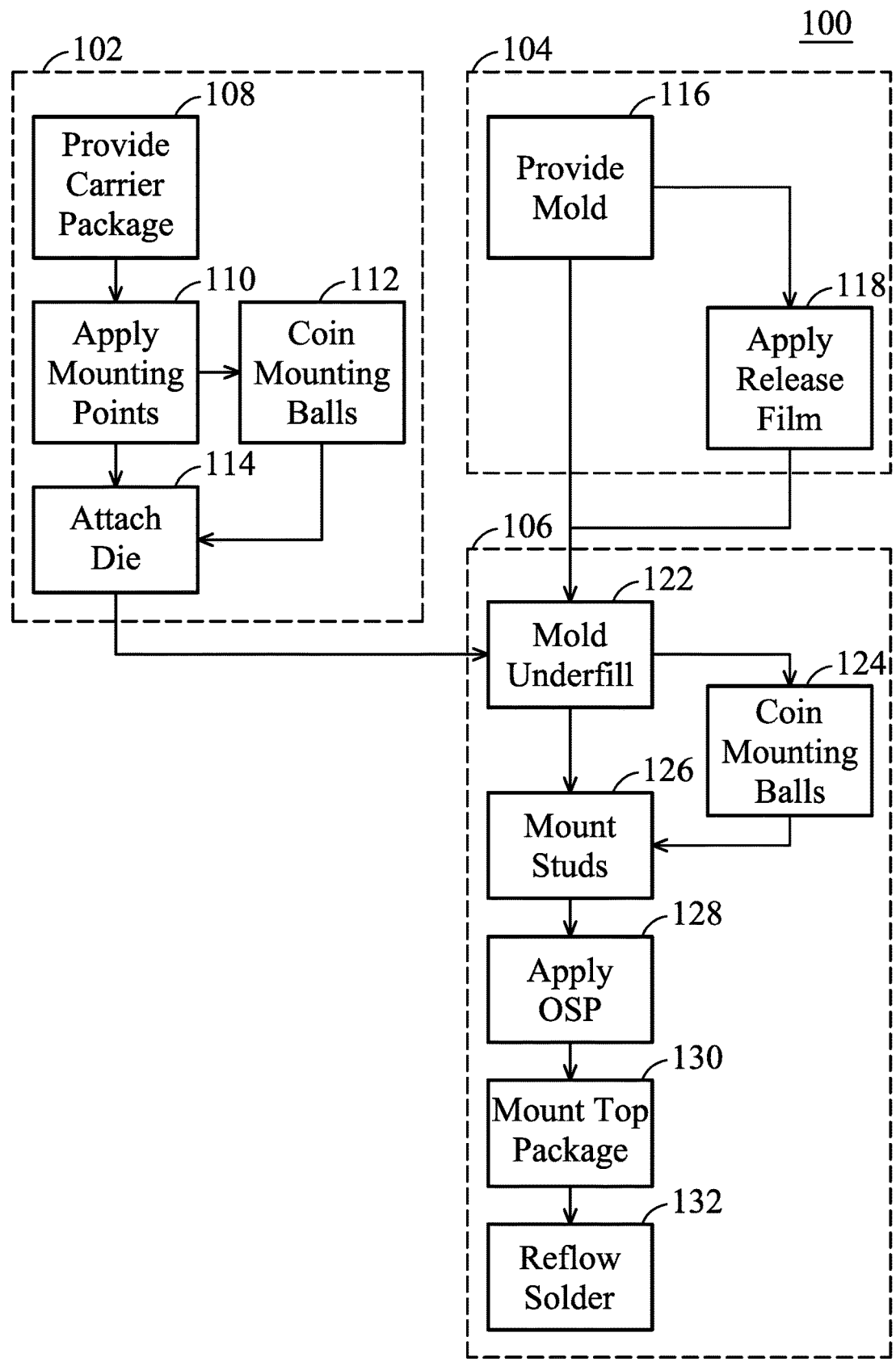
FIG. 1 shows a flow diagram illustrating a method for forming a package-on-package device with a molded underfilling.
Figure 2:
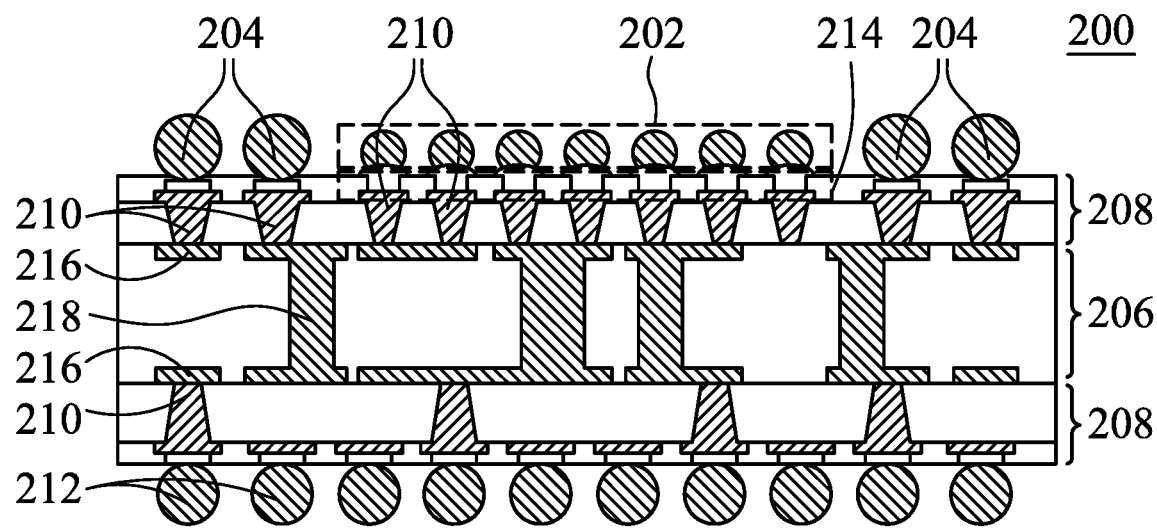
FIGS. 2 through 7 illustrate cross-sectional views of intermediate steps in forming an embodiment of a package-on-package device with a molded underfilling.

FIG. 1 shows a flow diagram illustrating a method 100 for forming a PoP device with a molded underfilling in accordance with an embodiment of the present disclosure. Referring first to FIG. 1, an interposer preparation procedure 102 and mold preparation procedure 104 are performed prior to a top package mounting procedure 106. FIG. 2 illustrates a carrier package 200. In the interposer preparation procedure 102, a carrier package 200 is provided in block 108, and die mounts 202, package mounts 204 and one or more dies 402 (see FIG. 4) are applied to a carrier package 200. While one carrier package 200 is shown in the drawings, several carrier packages 200 may optionally be processed on a workpiece comprising a plurality of carrier packages 200, and the workpiece may be singulated during a subsequent process step.

The carrier package 200 may have an interposer substrate 206 with one or more redistribution layers (RDLs) 208 disposed on one or both sides of the interposer substrate 206. The interposer substrate 206 may have substrate lands 216 on one or both sides, with the substrate lands 216 connected by through vias 218. The RDLs 208 may comprise one or more mounting pads or lands 210 which may be electrically connected to the substrate lands 216 of the interposer substrate, and by extension, to the vias 218.

Another embodiment may be where the carrier package 200 has an RDL 208 on the side of the interposer substrate 206 opposite the die mounts 202. The RDL 208 may have one or more lands 210 with PoP mounts 212, such as a ball grid array, or the like, that may allow the final PoP device to be mounted to another package, board, device, display, or the like.

Mounting points may be applied to the carrier package 200 in block 110. Referring back to FIG. 2, mounting points such as package mounts 204 and die mounts 202 may be disposed on the lands 210. In some embodiments, the package mounts 204 and/or the die mounts 202 are solder balls. Alternatively the die mounts 202 and package mounts 204 may be solid interconnects, or another package mounting apparatus. One or more surface vias 214 may be electrically connected to the lands 210, which are in turn connected to the substrate lands 216 and through vias 218. In some embodiments, the mounting points, as shown by the package mounts 204, may be disposed directly on the lands 210, or on a surface via 214 as illustrated by the die mounts 202.

Figure 3:
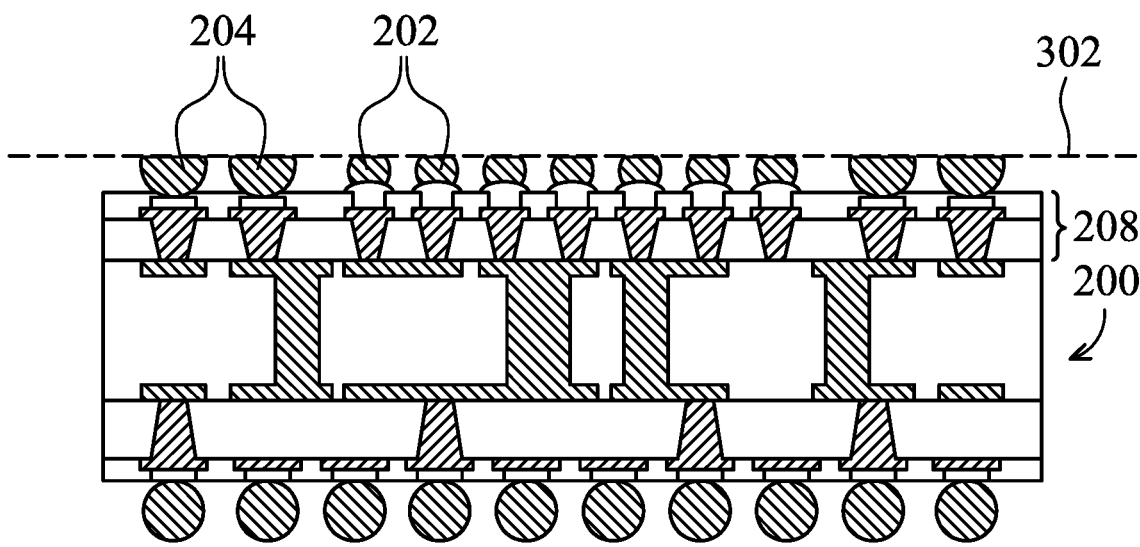

The die mounts 202 and package mounts 204 may optionally be coined, or trimmed, in block 112, and as illustrated in FIG. 3. In some embodiments, solder balls may be applied in block 110, and then coined once solidified in block 112. In some embodiments, coining the package mounts 204 or the die mounts 202 may comprise creating a substantially flat top surface on the package mounts 204 or the die mounts 202. In some embodiments, the flat coined surface or flat top section may be formed on the package mount 204 or die mount opposite the carrier package 200. As shown in FIG. 3, the package mounts 204 and die mounts 202 may be coined or trimmed at a single plane 302 to a predetermined height above the surface of the carrier package 200. In other embodiments, the package mounts 204 may be coined at a first plane to a first height, and the die mounts 202 may be coined at a second plane to a second, different height. Additionally, the first, package mount 204 height may be higher than the second, die mount 202 height, or alternatively, the first, package mount 204 height may be lower than the second, die mount 202 height. In other embodiments, the die mounts 202 may remain untrimmed, without coining, while the package mounts 204 may be coined to a predetermined height.

Figure 4:
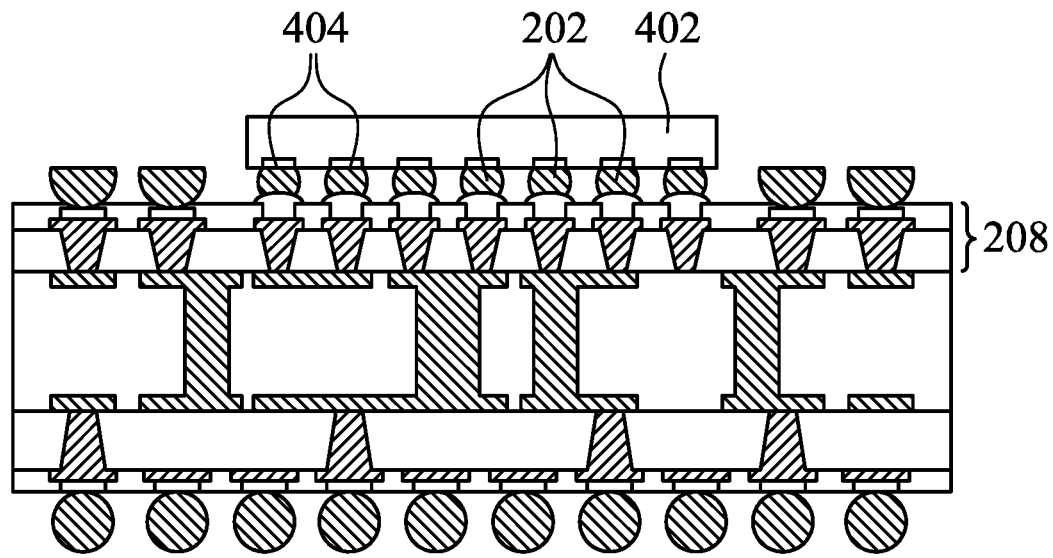

One or more dies 402 may be mounted on the die mounts 202 in block 114, as illustrated in FIG. 4. While FIG. 4 illustrates the mounting of a single die 402 for clarity, any number of dies 402 may be mounted to the die mounts 202. In embodiments where multiple dies 402 are to be mounted to the die mounts 202, the die mounts 202 may be configured in groups to accept the multiple dies 402.

The dies 402 may be mounted to the die mounts by attaching a die land 404 or other mounting pad to the die mounts 202. In embodiments where the die mounts 202 are solder balls, the solder ball die mounts 202 may be reflowed to attach the die mounts 202 to the die lands 404. In other embodiments, the die 402 may be temporarily mounted to the die mounts 202 via solder paste, a conductive adhesive, or the like, and the solder reflowed at a subsequent step to permanently mount the die 402 to the die mounts 202. In yet other embodiments, where the die mounts 202 are a solid interconnect, or other non-solder material, the die 402 may be attached to the solid interconnect with solder, solder paste or another conductive adhesive material.

Figure 5:
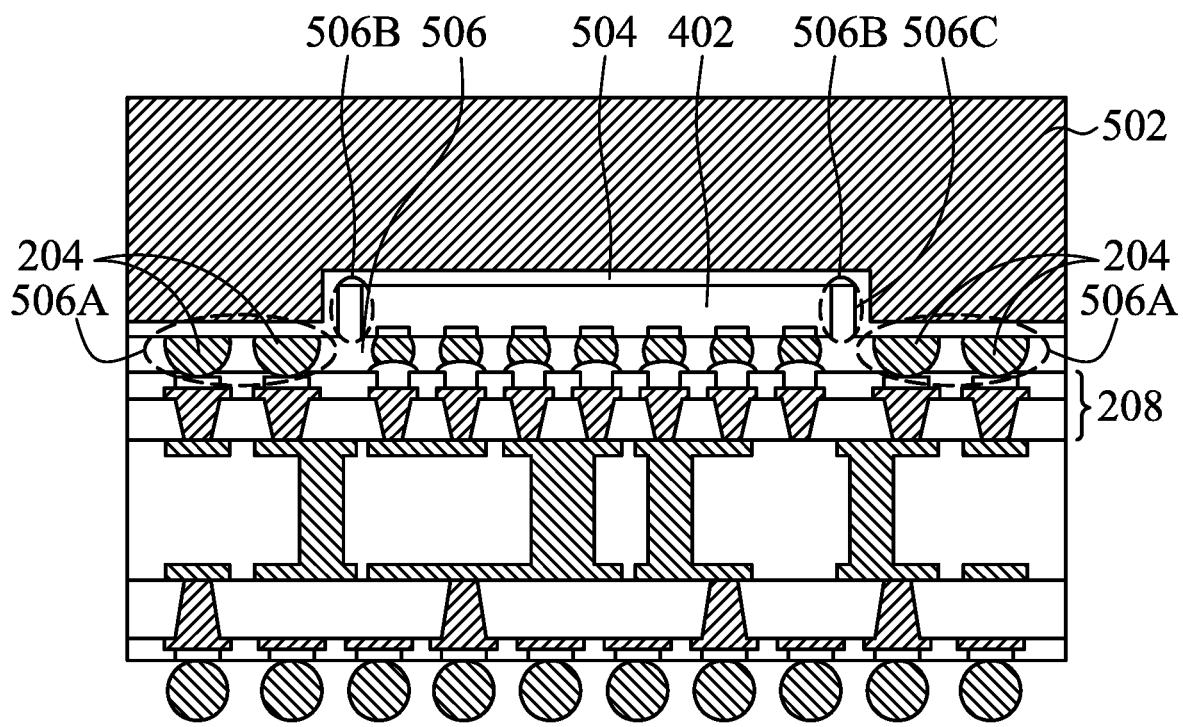

In a mold preparation procedure 104, a mold 502 may be provided in block 116 as shown in FIG. 5. A release film 504 may be optionally applied in block 118. The mold 502 may have a border or other feature for retaining underfilling material when applied. The mold 502, may, in some embodiments, be configured to accept one or more carrier packages 200 with dies 402, and recesses may be formed in the mold 502 to direct or form an underfilling (506 of FIG. 5) around the die 402, the die mounts 202, the package mounts 204 and the surface of the carrier package 200.

In a top package mounting procedure 106, a molded underfill (MUF) 506 may be applied to the carrier package 200, and may fill the area under the die 402, between the die mounts 202 and the area around the package mounts 204. In some embodiments, the MUF 506 may be a nonconductive material, and may be an epoxy, a resin, a moldable polymer, or the like. The MUF 506 may be applied while substantially liquid, and then may be cured through a chemical reaction, such as in an epoxy or resin. In other embodiments, the MUF 506 may be an ultraviolet (UV) or thermally cured polymer applied as a gel or malleable solid capable of being disposed between the die 402 and RDL 208 surface. In an embodiment employing material requiring UV or thermal energy to cure the MUF 506, the MUF 506 material may be molded into place, but may remain firm enough for the mold to be removed to expose the MUF 506 to UV or a thermal energy source for curing. The optional application of the release film 504 in block 118 may permit parting of the mold 502 from the MUF 506, and may be used in embodiments where the MUF 506 is an epoxy or resin to prevent the MUF 506 material from adhering to the mold 502 surface.

The mounts may optionally be coined in block 124. In particular, the package mounts 204 may be coined during molding of the underfill in block 122, or after the MUF 506 is formed. In some embodiments, the mold 502 may trim the package mounts 204 while applying the MUF 506. For example, the mold 502 may be heated to the point where excess material of package mounts 204 made of solder may be removed. Alternatively, a second mold patterned the same as the first mold 502, but with an abrasive disposed inside, may be used to abrade the package mounts 204 to a desired height after the MUF 506 is formed. In another embodiment, the MUF 506 may be applied so that the uncoined package mounts 204 extend above the surface of the MUF 506, and then the package mounts may be trimmed to substantially level with the top surface of the MUF 506 region surrounding the package mounts 204.

The MUF 506 may be applied, by, for example, injecting an epoxy of other flowable material into the MUF 506 space. In such embodiments, the mold 502 may have one or more injection ports through which the MUF 506 is injected. The mold 502 may have a border structure that retains the MUF 506 at the edge of the carrier package 200, or may contain the MUF 506 to a predefined area on the carrier package 200. In such an embodiment, the MUF 506 may be applied under pressure to force the MUF 506 material into the spaces between the package mounts 204 and under the die 402 and between the die mounts 202. In other embodiments, the mold 502 may be filled with the MUF 506 material, and the carrier package 200 placed into the mold. In some embodiments, the mold 502 may be upside down; with the carrier package 200 placed upside down into an MUF 506 material in the mold 502.

The MUF 506 may have one or more subregions, and may comprise a die sidewall MUF region 506B and a package mount MUF region 506A. The MUF 506 region surrounding the package mounts may be the package mount MUF region 506A, and MUF 506 may be applied so that the top surface of the MUF 506 is at substantially the same height as, or substantially level with, the coined surfaces of the package mounts 204. Alternatively, the MUF 506 may be applied and the package mounts 204 coined afterwards so that the coined, or top, surface of the package mounts 204 is substantially level with the top surface of the package mount MUF region 506A. The package mount MUF region 506A may at least partially enclose the package mounts 204 such that the package mounts 204 are at least partially disposed within the package mount MUF region 506A.

In the illustrated embodiment, the top surface of the package mount MUF region 506A may be lower than the top surface of the die 402, and substantially the same level as the top surface of the package mounts 204. The die sidewall MUF region 506B may cover at least a portion of the die 402 sidewall. In some embodiments, the die sidewall MUF region 506B may rise to about the top surface of the die 402 and be adhered to the die 402 sidewalls. While the die sidewall MUF region 506B is illustrated herein as having a substantially vertical external sidewall 506C, the angle of the die sidewall MUF region 506B external sidewall 506C may be at any angle, and may have any shape. For example, a slight taper to the MUF region 506B external sidewall 506C may permit the mold 502 to be more easily removed.

Figure 6:
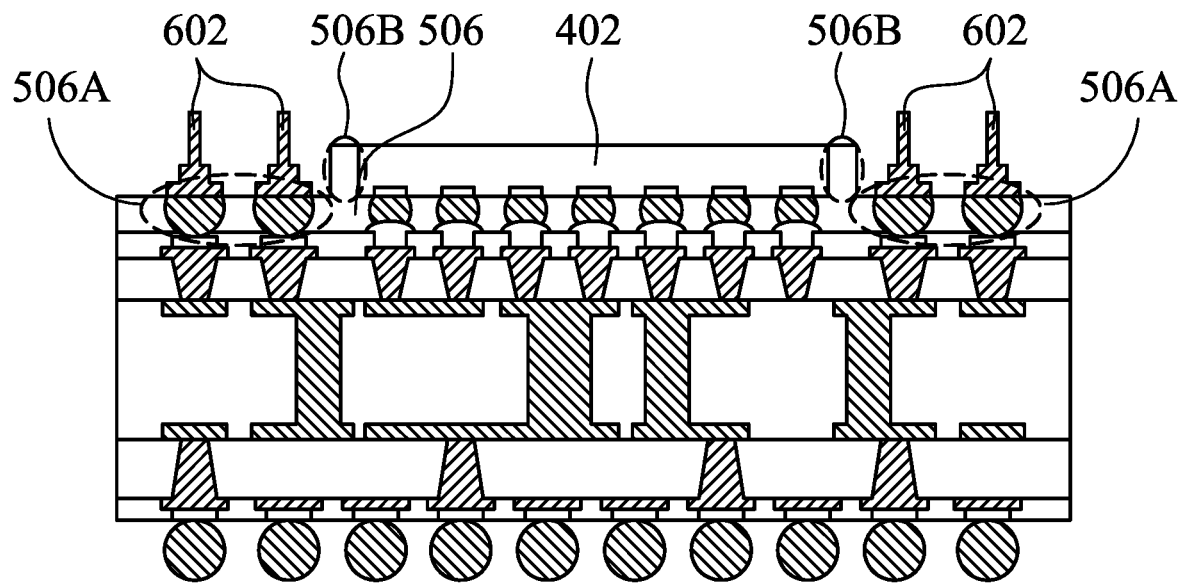

Package mounting studs 602 may optionally be applied to the package mounts 204 in block 126, as shown in FIG. 6. In some embodiments, the package mounting studs 602 may be solid interconnects and may optionally be disposed on the package mounts 204, and may be electrically connected to, or in electrical communication with the lands 210 (FIG. 2).

By extension, the package mounting studs 602 may be in electrical communication with one or more through vias 218 in the interposer substrate 206 (FIG. 2). The package mounting studs 602 may, in some embodiments, be wire attached, for example, by a wire bonding machine.

In another embodiment, the package mounting studs 602 may extend to at least the height of the top surface of the die 402. Additionally, the package mounting studs 602 may be configured to accept a top package 702 (not shown in FIG. 6, illustrated in FIG. 7) being mounted on them, with the package mounting studs 602 retaining the top package 702 above the die 402. The tops of package mounting studs 602 may be at a height sufficient to permit a top package to be held separated over the die 402, or with the top package in contact with the die 402.

An organic solderability preservative (OSP), or other solder-compatible coating may be applied in block 128. An anticorrosion coating such as a solderability preservative may be applied to the package mounting studs 602, to the package mounts 204, or to both the package mounting studs 602 and the package mounts 204. Alternatively, a coating not susceptible to corrosion may be applied to the package mounting studs 602, the package mounts 204, or both. For example, a coating of gold (Au), palladium (Pd), nickel (Ni), alloys of the foregoing, or the like may be used over the package mounting studs 602 or the package mounts 204. An OSP may be advantageous where a carrier package 200 is prepared or assembled prior to mounting a final assembly or top package 702 (FIG. 7), as the OSP may protect or preserve the surface of a package mounting stud 602 or package mount 204 that may be prone to corrosion.

Figure 7:
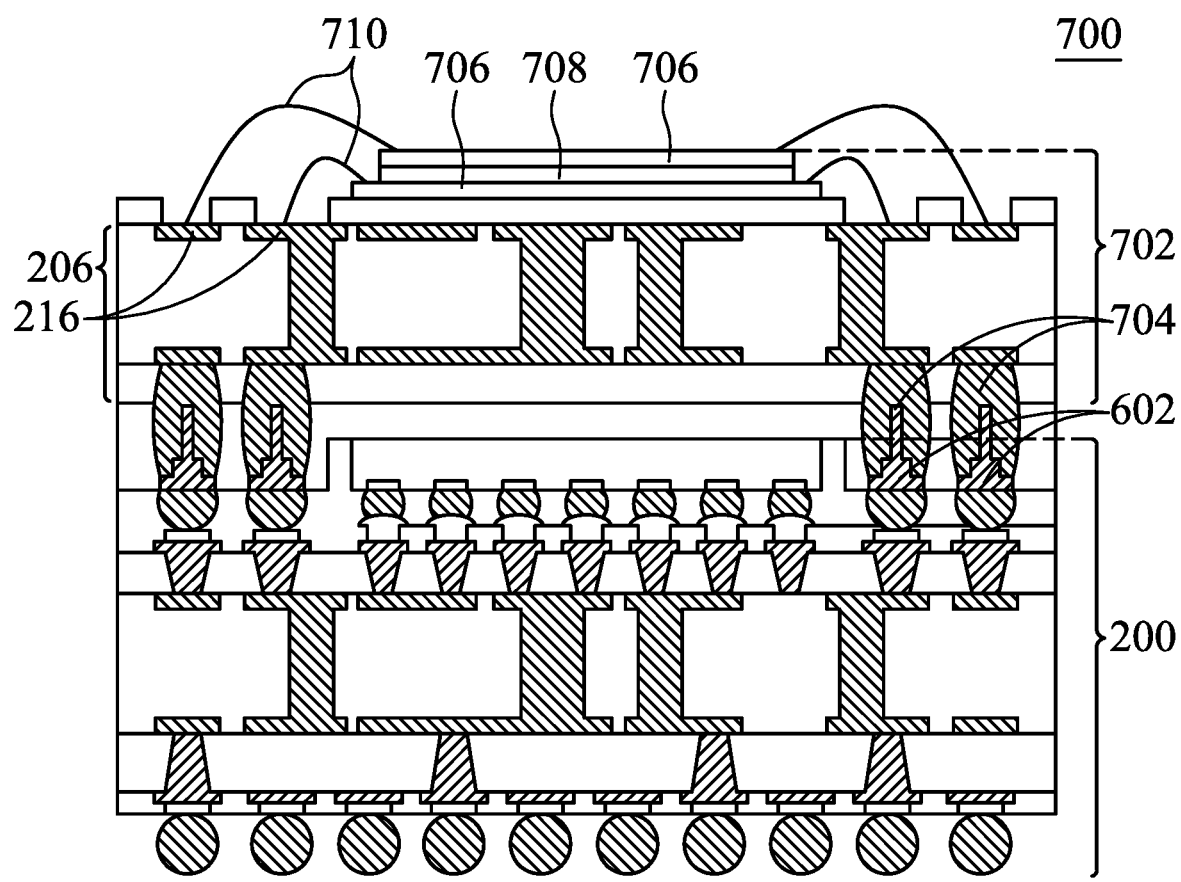

A top package 702 may be mounted in block 130 and the solder may be reflowed to attach the top package 702 to the carrier package 200 in block 132. FIG. 7 illustrates a package-on-package device 700 with a top package 702 mounted on a carrier package 200 in accordance with various embodiments of the present disclosure. In some embodiments, the top package 702 may be mounted at a height where the bottom surface of the top package 702 is separated from the top surface of the die 402. In an embodiment where package mounting studs 602 are employed, the package mounting studs 602 may be formed at a height sufficient to hold the top package separated from the top surface of the die 402. In another embodiment, the bottom surface of top package 702 may be in direct contact with the top surface of the die 402, or may have an adhesive, heat transfer compound or heat sink disposed between the top package 702 and the top surface of the die 402.

In some embodiments, the top package 702 may have an interposer substrate 206 with substrate lands 216 disposed on one or more sides of the interposer substrate to connect vias through the interposer substrate 206. One or more package connectors 704 may be applied to connect the top package 702 to the package mounting studs 602. In some embodiments, the package connectors 704 may be solder balls applied to substrate lands 216 on the bottom of the top package 702. In such embodiments, the solder ball package connector 704 may be reflowed to attach the top package 702 to the package mounting studs 602, where used. In other embodiments where a package mounting stud 602 is avoided, the top package 702 may attach directly to the package mounts 204. In yet other embodiments, the package connectors 704 may be solder paste, a conductive adhesive, or the like.

A top package 702 may, in some embodiments, have one or more top dies 706 attached via an adhesive 708 or other mounting technique. A top die 706 may be electrically connected to one or more substrate lands 216 in the interposer substrate 206 via a wire bond 710. In other embodiments, the top die 706 may be mounted to the top package 702 interposer substrate 206 via a ball grid array on die lands 404, via a socket, via surface mounting technology, or the like. The top die 706 may, in some embodiments, be in electrical communication with the carrier package 200 via the package mounting studs 602, and the package mounts 204.

Figure 8A:
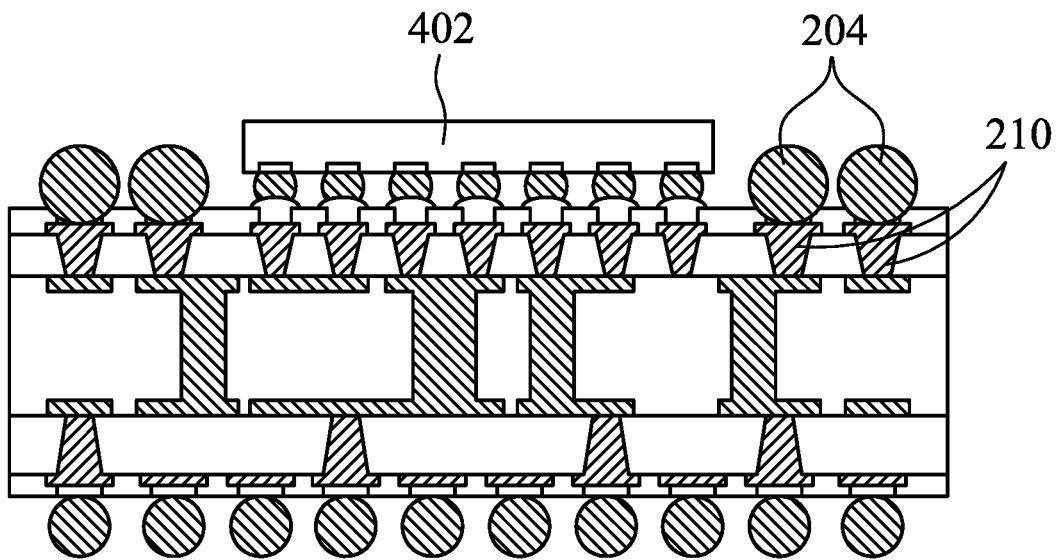
FIGS. 8A through 8D and 9A through 9D illustrate embodiments of methods for forming a package-on-package device with a molded underfilling.
Figure 8B:
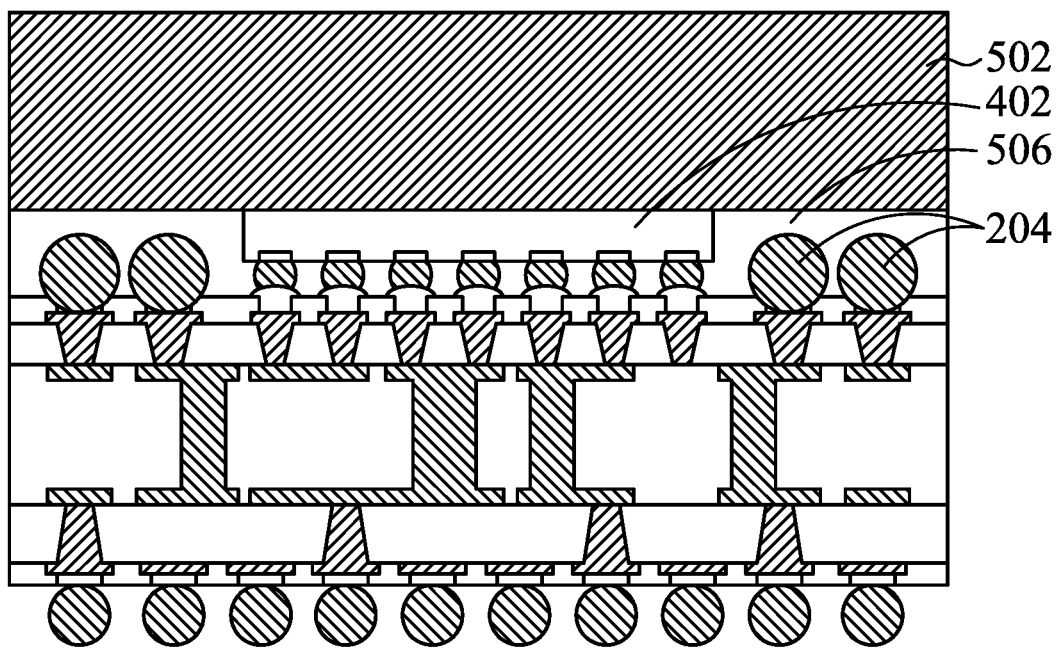

FIGS. 8A-8D illustrates a cross-sectional view of an embodiment for forming a carrier package 200 with a grooved MUF 506 according to the present disclosure. Package mounts 204 may be applied and die 402 mounted, as shown in FIG. 8A and as described above with respect to FIGS. 2 and 4. As shown in FIG. 8B, the MUF 506 may be applied over the package mounts 204. In some embodiments, the MUF 506 may cover the package mounts 204, and may have a top surface substantially level with the die 402. A mold 502 may be used to form or retain the MUF 506, and may have a substantially planar molding surface used to form the top surface of the MUF 506.

Figure 8C:
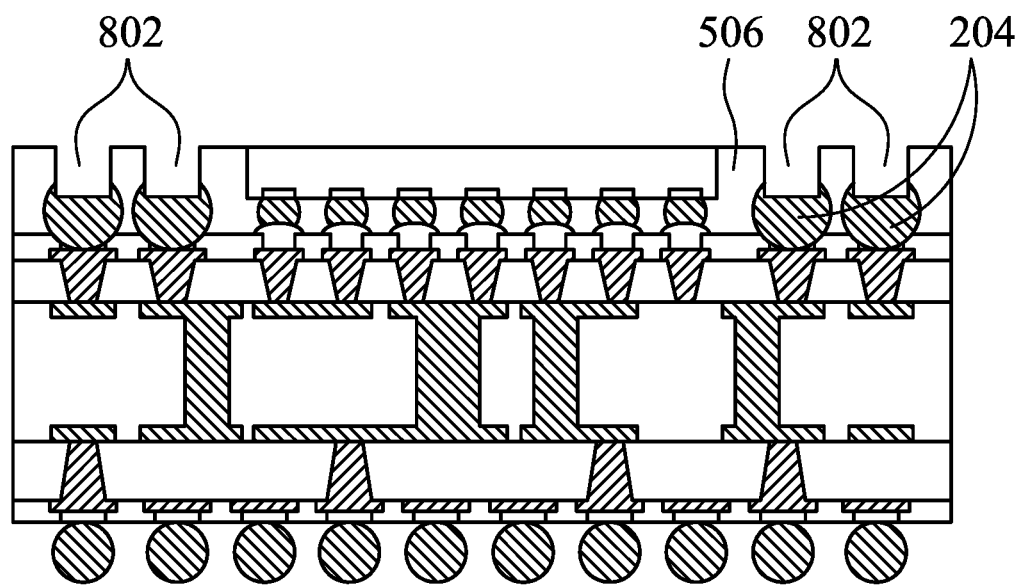

The MUF 506 and package mounts 204 may be grooved, as shown in FIG. 8C. Mounting grooves 802 may be formed through the MUF 506 and extending into a portion of the package mounts 204. A flat surface may be created on, or within, the package mounts 204. In some embodiments, the mounting grooves 802 are formed with a flat bottom surface. The bottom surface of the mounting grooves 802 may be disposed in the package mounts 204, resulting in a flat-bottomed recess in the package mounts 204. In some embodiments, the mounting grooves 802 may be formed via a mechanical process, such as milling, sawing or drilling, or in other embodiments, via another suitable process.

Figure 8D:
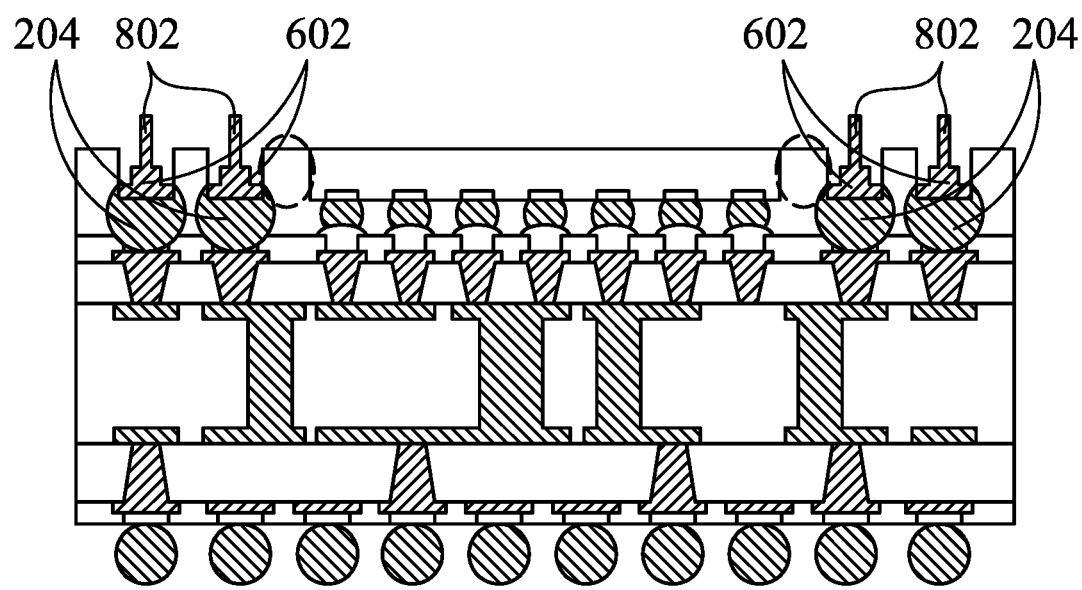

As shown in FIG. 8D, package mounting studs 602 may optionally be disposed within the mounting grooves 802. In some embodiments, the package mounting studs 602 may extend higher than the surface of the MUF 506. The mounting grooves 802 may be configured so that a top package (702 of FIG. 7) may be mounted on the package mounting studs 602, and package connectors (704 of FIG. 7) may extend into the mounting grooves 802 to attach the top package 702 to the package mounting studs 602.

Figure 9A:
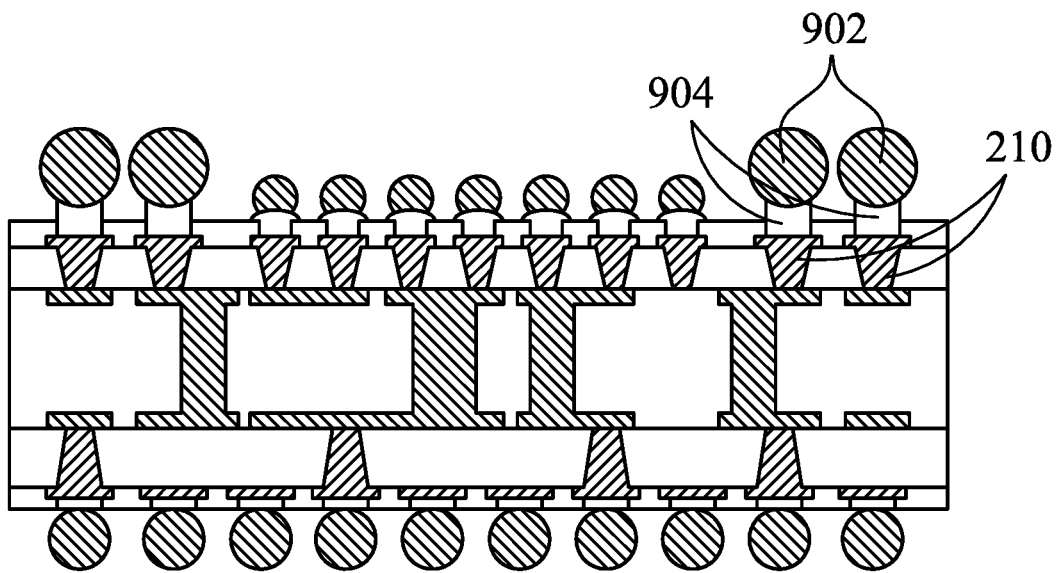

FIGS. 9A-9D illustrate a cross-sectional view of an embodiment for forming a carrier package 200 with embedded package mounting structures 902 according to the present disclosure. Package mounting structures 902 may be applied to the lands 210 with solder paste 904, solder, or another suitable conductive attachment process as shown in FIG. 9A. In some embodiments, the package mounting structures 902 may be a non-fusible or non-solder metal such as copper. In other embodiments, the package mounting structures 902 may be any other suitable material such as tungsten, gold, aluminum, tantalum, alloys of the same, or the like. The package mounting structures 902 may be shaped as, for example, balls, posts, posts or the like.

Figure 9B:
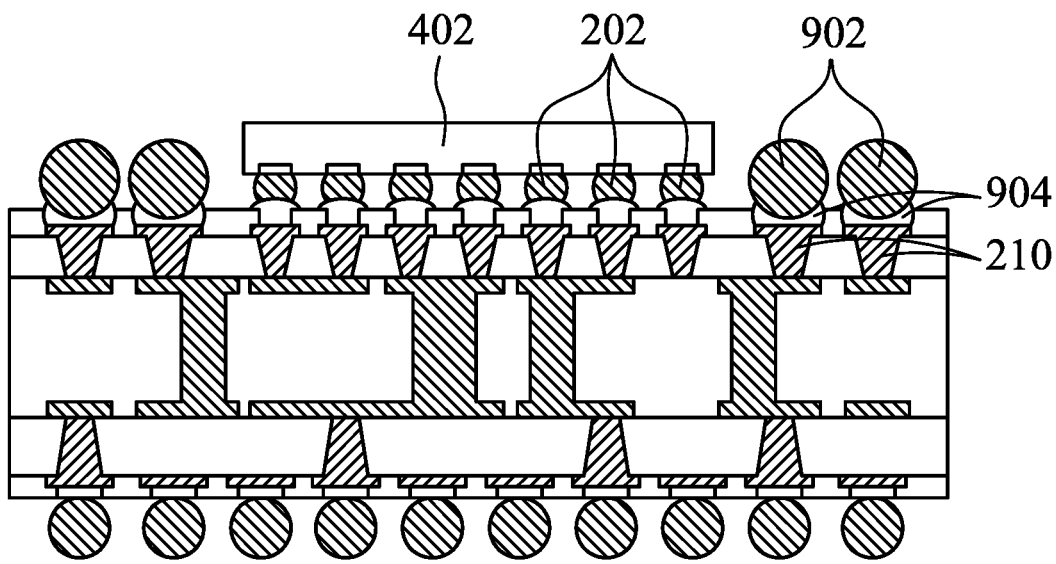
Figure 9C:
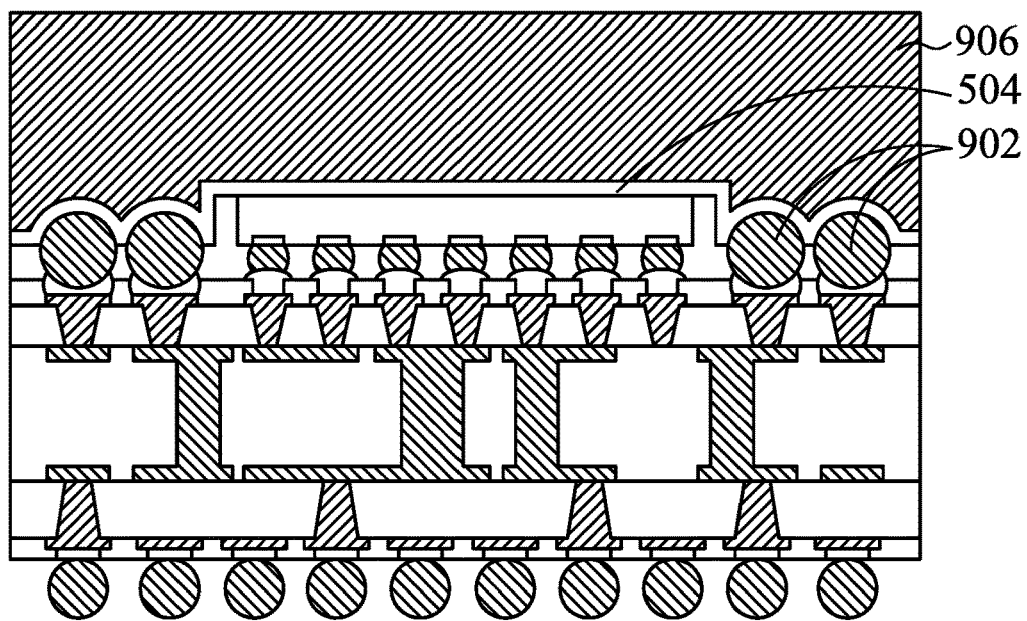

A die 402 may be mounted, and a solder reflow process performed to affix the die 402 to the die mounts 202 and package mounting structures 902 to the lands 210, as shown in FIG. 9B. FIG. 9C illustrates formation of an MUF 506 around the package mounting structures 902 in accordance with various embodiments of the present disclosure. A contoured mold 906 may have one or more contoured recesses configured to conform to the package mounting structures 902. The MUF 506 may be formed so that the package mounting structures 902 extend beyond the MUF 506 surface in the region surrounding the package mounting structures 920.

Figure 9D:
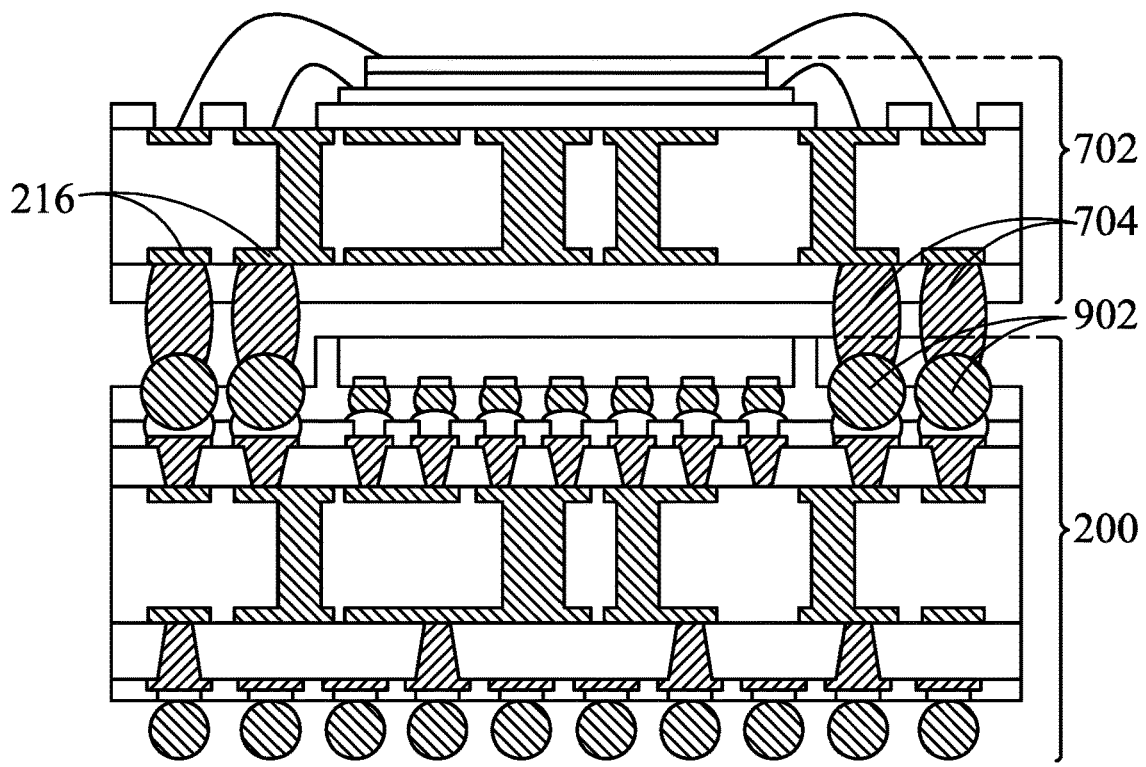

FIG. 9D illustrates mounting a top package 702 on the package mounting structures 902 in accordance with various embodiments of the present disclosure. One or more package connectors 704 may attach to the portions of the package mounting structures exposed or extending above the MUF 506 surface.

Figure 10:
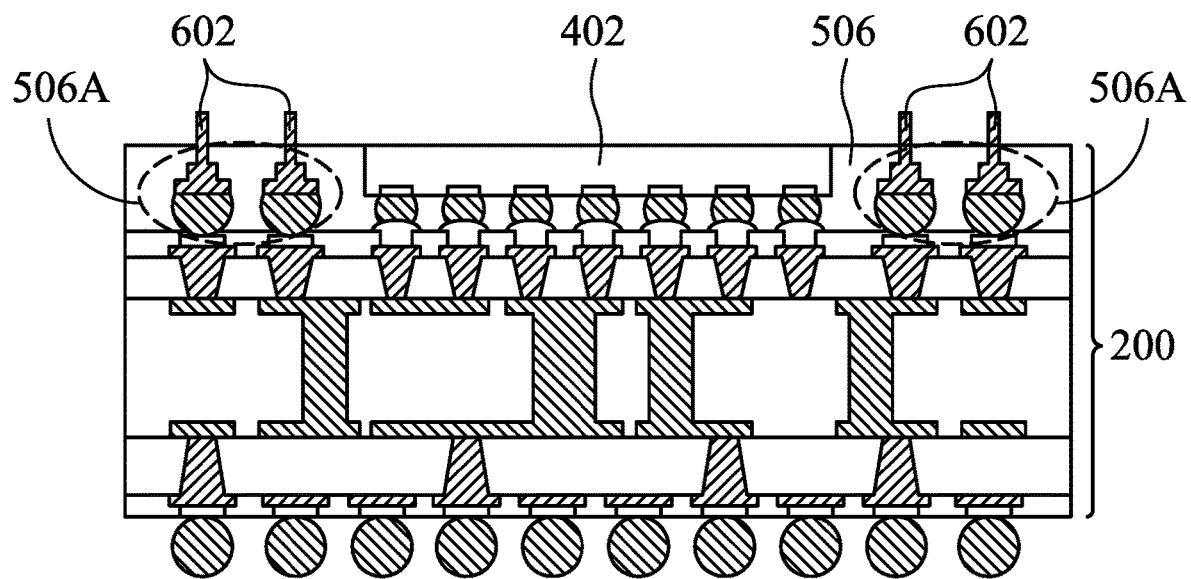
FIGS. 10-13 illustrate cross-sectional views of embodiments of a package-on-package device with a molded underfilling.

FIG. 10 illustrates a cross-sectional view of a carrier package 200 with an MUF 506 in accordance with various embodiments of the present disclosure. In the embodiment of FIG. 10, the package mounting studs 602 may be applied to the package mounts 204 and the MUF 506 may be applied to cover a base section of the package mounting studs 602 in the package mount MUF region 506A. In some embodiments, at least a portion of the package mounting studs 602 extends above the top surface of the MUF 506. In other embodiments, the MUF 506 is applied to be substantially the same level as the top surface of the die 402. In such embodiments, the top surface of the die 402 may be substantially free of MUF 506 material.

Figure 11:
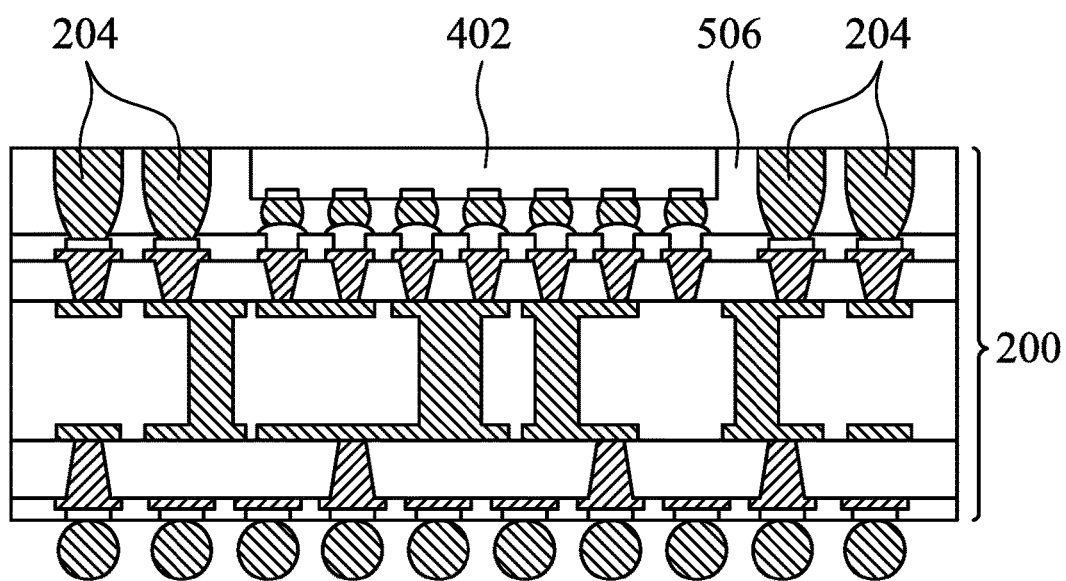

FIG. 11 illustrates a cross-sectional view of a carrier package 200 with an MUF 506 in accordance with various embodiments of the present disclosure. The package mounts 204 may extend to the top surface of the MUF 506, which may be applied to be substantially the same level as the top surface of the die 402. In such embodiments, the package mounting studs 602 may be eliminated, or, alternatively, may be applied on extended height package mounts 204.

Figure 12:
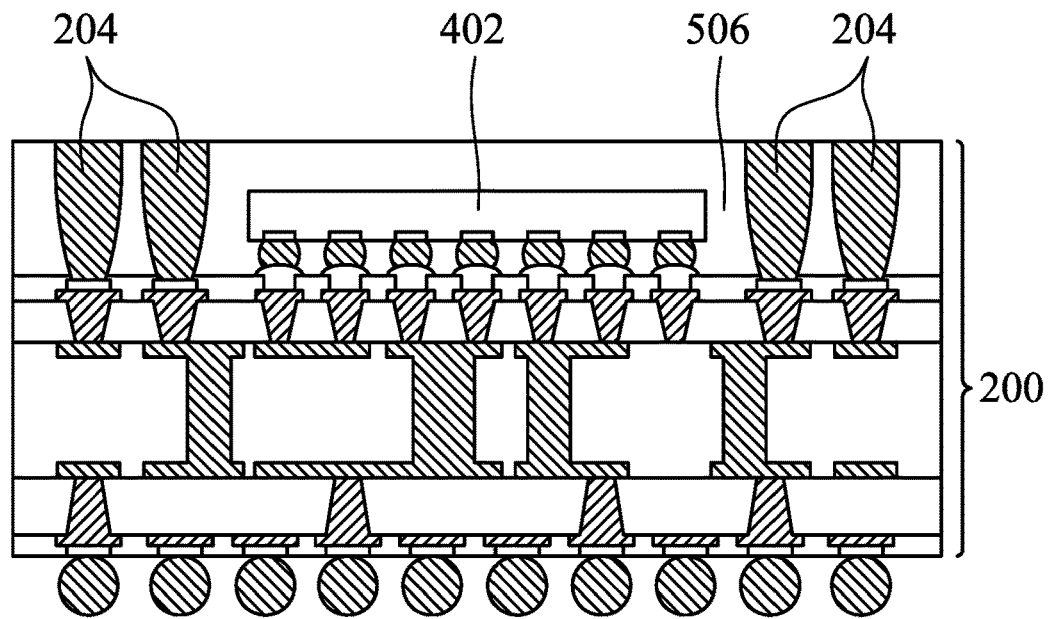

FIG. 12 illustrates a cross-sectional view of a carrier package 200 with an MUF 506 in accordance with various embodiments of the present disclosure. The package mounts 204 may extend to the top surface of the MUF 506, which may be higher than the level of the top surface of the die 402. In such embodiments the MUF may cover the die 402.

Figure 13:
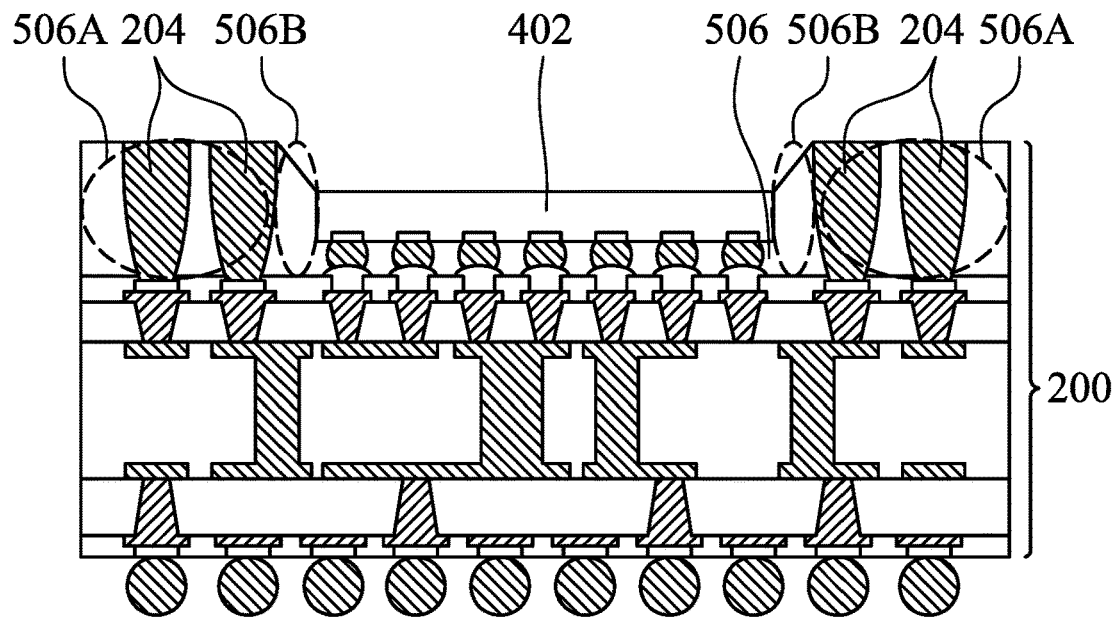

FIG. 13 illustrates a cross-sectional view of a carrier package 200 with an MUF 506 in accordance with various embodiments of the present disclosure. The package mounts 204 may extend to the top surface of the MUF 506, which may be higher than the level of the top surface of the die 402 in the package mount MUF region 506A. The MUF 506 may be applied so that the top surface of the die 402 is exposed. The die sidewall MUF region 506B may, in some embodiments, slope from the package mount MUF region 506A to the die 402, or may, alternatively, have a vertical sidewall transitioning from the package mount MUF region 506A to the die 402. In some embodiments, the recessed MUF 506 exposing the die 402 top surface may permit airflow over the die 402, application of a heatsink or the like.

In an embodiment, a device is provided. The device includes a carrier package having at least one land, a package mount disposed on a first side of the carrier package and in electrical communication with a land of the carrier package, a die mount disposed on the first side of the carrier package, and a die mounted on the die mount. The device further includes a molded underfill (MUF) disposed on the first side of the carrier package, the MUF in contact with at least a portion of the package mount and in contact with at least a portion of a sidewall of the die, wherein the MUF comprises a package mount MUF region and a die sidewall MUF region, the die sidewall MUF region in contact with at least a portion of the die sidewall and the package mount at least partially disposed within the package mount MUF region and wherein a top surface of the package mount MUF region is at a different height than a top surface of the die sidewall MUF region.

In an embodiment, a device is provided. The device includes a carrier package having at least one land, a package mount disposed on a first side of the carrier package and in electrical communication with a land of the carrier package, and a die disposed on the first side of the carrier package. The device further includes a molded underfill (MUF) disposed on the first side of the carrier package and having at least a package mount MUF region and a die sidewall MUF region, the die sidewall MUF region in contact with at least a portion of a die sidewall and the package mount at least partially disposed within the package mount MUF region, the package mount not extending above an upper surface of the die.

In an embodiment, a device is provided. The device includes a die mount on a first side of a carrier package, a package mount on the first side of the carrier package, a top surface of the package mount having a recess, and a die mounted on the die mount. The device further includes a molded underfill (MUF) over the first side of the carrier package, the MUF being in contact with a sidewall of the die and extending above a topmost surface of the package mount, the molded underfill having an opening above the recess in the package mount.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification.

As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a carrier package having at least one land;
    a package mount disposed on a first side of the carrier package and in electrical communication with a land of the carrier package;
    a die mount disposed on the first side of the carrier package;
    a die mounted on the die mount, the die having a die sidewall, the die mount being directly coupled to the die, the die mount being directly below the die, wherein the die mount is laterally spaced apart from the die sidewall in a first direction, and wherein the package mount is laterally spaced apart from the die sidewall in a second direction opposite to the first direction; and
    a molded underfill (MUF) disposed on the first side of the carrier package, the MUF being in contact with a portion of the package mount and a portion of the die sidewall, an entirety of a topmost surface of the die being free of the MUF, wherein the MUF comprises a package mount MUF region and a die sidewall MUF region, the die sidewall MUF region being in contact with the portion of the die sidewall and the package mount being at least partially disposed within the package mount MUF region, wherein the die sidewall MUF region is interposed between the die and the package mount, wherein a topmost surface of the package mount MUF region is at a different height than the topmost surface of the die sidewall MUF region, wherein the topmost surface of the package mount MUF region is above the topmost surface of the die, the MUF having a first continuous topmost surface from the topmost surface of the die sidewall MUF region to the package mount MUF region, the first continuous topmost surface being non-planar, the package mount not extending above an upper surface of the package mount MUF region.

2. The device of claim 1, wherein the package mount has a substantially flat section opposite the carrier package.

3. The device of claim 2, wherein the flat section of the package mount is above the topmost surface of the die.

4. The device of claim 2, wherein the die mount has a substantially flat section opposite the carrier package, and wherein the flat section of the die mount is lower than the flat section of the package mount.

5. The device of claim 1, wherein a height of the package mount is greater than a height of the die mount.

6. The device of claim 1, wherein the die sidewall MUF region has a sloped sidewall.

7. The device of claim 1, wherein the package mount comprises a solder.

8. The device of claim 1, wherein a bottommost surface of the package mount is below a bottommost surface of the die mount.

9. A device comprising:
a carrier package having at least one land;
a first package mount and a second package mount disposed on a first side of the carrier package and in electrical communication with a land of the carrier package;
a die mount disposed on the first side of the carrier package, wherein the first package mount is laterally interposed between the second package mount and the die mount, and wherein a bottommost surface of the die mount is above a bottommost surface of the first package mount and a bottommost surface of the second package mount;
a die disposed on the first side of the carrier package, the die mount being interposed between the die and the carrier package, the die mount electrically coupling the die to the carrier package, the die having a die sidewall; and
a molded underfill (MUF) disposed on the first side of the carrier package and having at least a package mount MUF region and a die sidewall MUF region, the die sidewall MUF region being in contact with at least a portion of the die sidewall, the first package mount being at least partially disposed within the package mount MUF region, the MUF being a single continuous layer, the single continuous layer being interposed between the die sidewall and the first package mount, the single continuous layer being interposed between the first package mount and the second package mount, the package mount MUF region extending from the first package mount to the second package mount, an uppermost surface of the package mount MUF region being lower than an upper surface of the die sidewall MUF region, the die sidewall MUF region and the first package mount not extending above an upper surface of the die.

10. The device of claim 9 wherein the first package mount has a substantially flat top section opposite the carrier package, the flat top section substantially level with a top surface of the package mount MUF region.

11. The device of claim 9, further comprising a top package mounted to the first package mount, the top package disposed above the die.

12. The device of claim 11, wherein a bottom surface of the top package is separated from a top surface of the die.

13. The device of claim 11, further comprising a package mounting stud disposed on the first package mount, the top package disposed on the package mounting stud and in electrical communication with the carrier package via the package mounting stud and the first package mount.

14. A device comprising:
a die mount on a first side of a carrier package;
a package mount on the first side of the carrier package, a top surface of the package mount having a recess, wherein a bottommost surface of the die mount is above a bottommost surface of the package mount, and wherein the bottommost surface of the die mount is below a bottom of the recess;
a die mounted on the die mount; and
a molded underfill (MUF) over the first side of the carrier package, the MUF being a single continuous layer, the single continuous layer being in direct contact with a sidewall of the die and extending above a topmost surface of the package mount, the single continuous layer being interposed directly between the package mount and another package mount along a shortest line between the package mount and the another package mount, the package mount being laterally spaced apart from the another package mount, the bottommost surface of the die mount being above a bottommost surface of the anther package mount, the MUF having an opening above the recess in the package mount.

15. The device of claim 14, further comprising a package mounting stud extending through the opening and contacting the package mount in the recess of the package mount.

16. The device of claim 15, further comprising a package mounted to the package mounting stud.

17. The device of claim 16, wherein the package comprises a plurality of dies mounted on a package substrate.

18. The device of claim 14, wherein the MUF contacts at least a portion of the top surface of the package mount.

19. The device of claim 14, wherein an uppermost surface of the MUF is level with an uppermost surface of the die.

20. The device of claim 14, wherein the MUF extends between the carrier package and the die.

* * * * *